United States Patent

[11] 3,621,303

[72] Inventor Claude Roger Fonjallaz
Cormondreche, Switzerland
[21] Appl. No. 873,441
[22] Filed Nov. 3, 1969
[45] Patented Nov. 16, 1971
[73] Assignee Centre Electronique Horloger S.A.
Brequet-Neuchatel, Switzerland
[32] Priority Nov. 7, 1968
[33] Switzerland
[31] 16.596/68

[54] BISTABLE MULTIVIBRATOR CIRCUIT
7 Claims, 4 Drawing Figs.

[52] U.S. Cl. 307/292
[51] Int. Cl. H03k 3/286
[50] Field of Search 307/291, 292

[56] References Cited
UNITED STATES PATENTS
2,945,965 7/1960 Clark 307/291 X
3,042,814 7/1962 Campbell 307/291 X

*Primary Examiner*—John S. Heyman
*Attorney*—Stevens, Davis, Miller & Mosher

ABSTRACT: A bistable multivibrator including two symmetrically arranged pairs of transistors in which, in each pair, the emitters and the collectors of a first and of a second transistor respectively are connected together to form common emitter and collector circuits, the base of the first transistor of each pair being connected to the collector circuit of the other pair. First and second supplementary transistors are provided, each having its collector connected to the common collector circuit of a corresponding transistor pair, its base to the base of the first transistor for each of said corresponding transistor pair and its emitter to the base of the second transistor of said corresponding transistor pair. Further, first and second pairs of bias diodes are coupled between the base of the second transistor and common collector circuit of the first and second pairs respectively of the symmetrically arranged transistor pairs.

BISTABLE MULTIVIBRATOR CIRCUIT

BACKGROUND OF THE INVENTION

In a multivibrator previously developed and of the type disclosed herein, it has been found that operation is very much influenced by the temperature, so that it can be used only in a few cases.

Furthermore, the known multivibrator always includes resistors of a relatively high value, which render difficult the integration of the circuit in a monolithic form.

OBJECT OF THE INVENTION

The aim of the invention is to avoid these disadvantages and to provide a bistable multivibrator which, due to the fact that it needs only a low voltage supply and has low power consumption, responds positively to input signals of low magnitude by switching from a first stable state to a second. Further the elements of the multivibrator can be integrated without difficulty, and the parasitical effects appearing between the elements when built as an integrated circuit, contribute to improve its operation.

DEFINITION OF THE INVENTION

The present invention concerns a bistable multivibrator circuit comprising two symmetrically arranged pairs of transistors in which, in each pair, the emitters and the collectors of a first and of a second transistor respectively are connected together to form common emitter and collector circuits, the base of the first transistor of each pair being connected to the collector of the other pair. First and second supplementary transistors are provided, each having its collector circuit connected to the common-collector circuit of a corresponding transistor pair, its base to the base of the first transistor of said corresponding transistor pair and its emitter to the base of the second transistor of said corresponding transistor pair. Further, first and second pairs of bias diodes are coupled between the base of the second transistor and common collector circuit of the first and second pairs respectively of the symmetrically arranged transistor pairs.

PREFERRED EMBODIMENTS

In the integrated form of the multivibrator, one of the bias diodes connected to the base of the second transistor of each of the pairs of transistors can be constituted by a transistor which forms, with the supplementary transistor of the corresponding pair, a common emitter-collector circuit, of which the base is connected to the collector circuit of the transistor pair through the other bias diode. A diode can be connected in the collector circuit of each of the transistor pairs to prevent too narrow coupling through the bias diodes between the collectors of each of the pairs of transistors and the bases of the second transistors of the pair.

Each of the pairs of transistors can advantageously be integrated with the corresponding supplementary transistory and one of the two bias diodes in an insulated island of a semiconductor substrate in which is integrated the whole circuit.

The other bias diode can be integrated with an ohmic resistor in the collector circuit of the corresponding pair of transistors in an insulated island of the substrate.

Preferably, two coupling condensers are integrated together at the input of the multivibrator, in an insulated island of the substrate, an electrode of each of the condensers being connected to the base of the second transistor of one of the pairs of transistors.

The diodes placed in the collector circuit of each of the pairs of transistors can be integrated, with the corresponding pair of transistors, in an insulated island of the substrate.

This produces parasitical emitter effects which reduce the efficiency of the multivibrator. This disadvantage can be avoided by integrating separately in the insulated islands of the substrate diodes placed in the collector circuit of each of the pairs of transistors.

The drawing shows two embodiments of the bistable multivibrator according to the invention.

In all the figures, the same parts have been given the same reference symbols.

Figure 1:
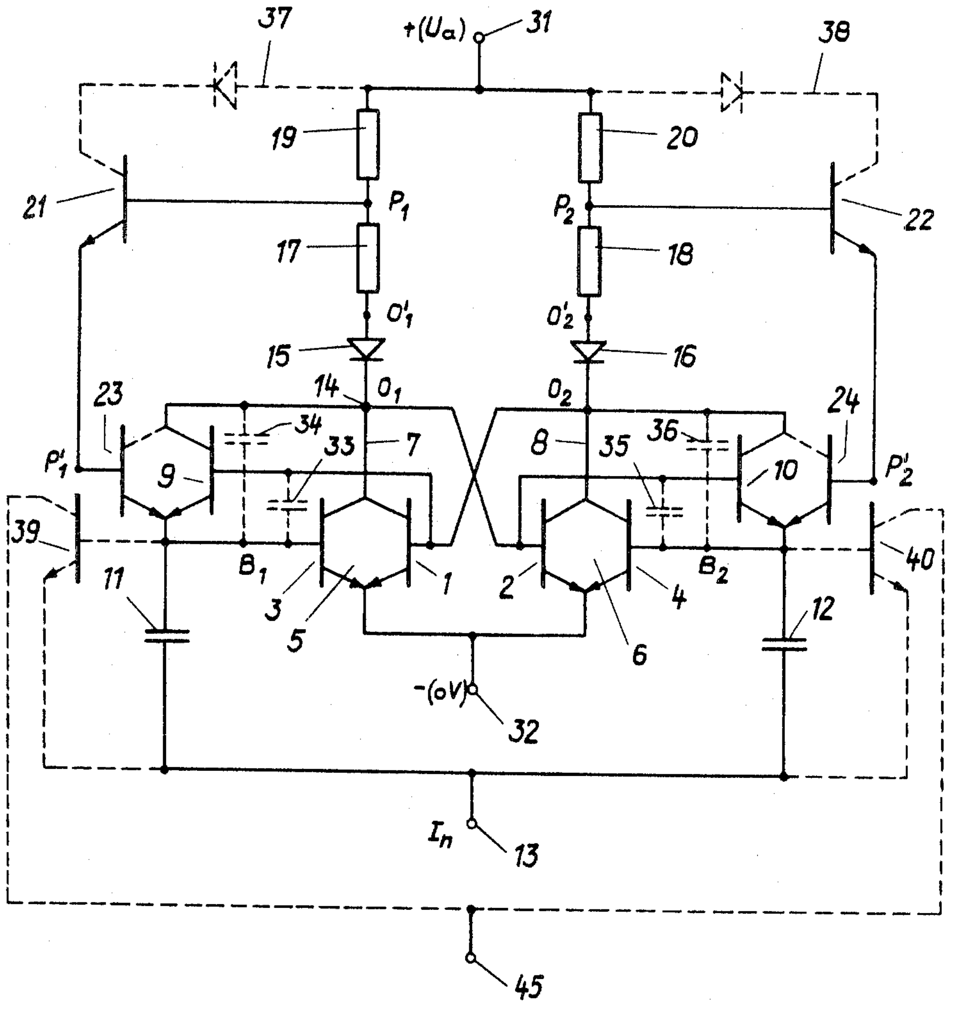
FIG. 1 shows the diagram of a bistable multivibrator.

The first transistors 1 and 2 form each, with the second transistors 3 and 4, two symmetrically arranged transistor pairs of 5 and 6.

The collectors of the first transistor 1 and of the second transistor 3 are connected in a common collector circuit 7, while the collectors of the transistors 2 and 4 are connected in a common collector circuit 8.

The emitters of the two pairs of transistors form two common emitter circuits which are connected together by a terminal 32 to one of the electrodes of a voltage source.

The pair of transistors 5 cooperates with a supplementary transistor 9 and the pair of transistors 6 with a supplementary transistor 10. The collector of each of these supplementary transistors 9 and 10 is connected with the collectors of the corresponding pairs, and the base of each supplementary transistor is connected to the base of the first transistor 1 or 2 respectively of the corresponding pair.

The emitter of each of the two supplementary transmitters 9 and 10 is connected to the base of the second transistor of the corresponding pair.

The bases of the second transistors 3 and 4 of the two pairs 5 and 6 of the transistors are connected together by input condensers 11 and 12 respectively to an input 13 terminal of the bistable multivibrator.

The base of transistor 1 is connected to the collectors of the pair 6 of transistors, while the base of transistor 2 is connected to the collectors of pair 5 of transistors.

One of the links between the collectors of one pair and the base of the first transistor of the other pair constitutes an output 14 of the multivibrator. Diodes 15 and 16 respectively, ohmic resistors 17 and 18 respectively, other ohmic resistors 19 and 20 respectively, placed in the collector circuits 7 and 8, are connected in series with the connectors $0_1$, $0_1'$ and $0_2$, $0_2'$ respectively. Terminals of the two collector circuits 7 and 8 are connected together to the other electrode of the voltage source through terminal 31.

Besides, each of the two pairs 5 and 6 cooperates with two series-connected bias diodes 21, 23 and 22 and 24, respectively. Diode 23 is connected to the base of the second transistor 3 and diode 21 is connected to the median plug $P_1$ between the two resistors 17 and 19 placed in the collector circuit 7. Similarly, diode 24 is connected to the base of the second transistor 4 and diode 22 is connected to the median plug $P_2$ between the resistors 18 and 20 placed in the collector circuit 8.

Figure 2:
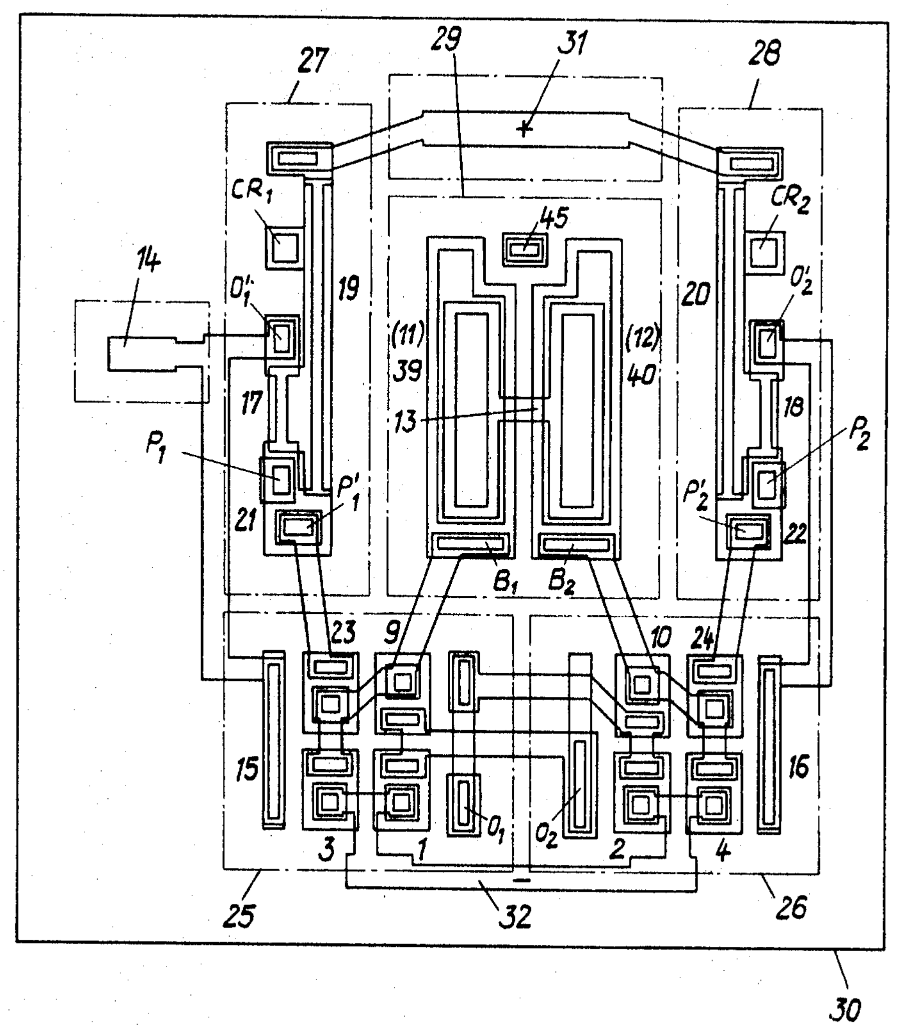
FIG. 2 is a plan view of a semiconductor substrate, in which the circuit of FIG. 1 has been integrated.

As represented on FIG. 2, all the main elements of the circuit of FIG. 1, are integrated in five islands, 25 to 29, insulated one from the other by a semiconductor plate substrate.

Island 25 includes transistors 1, 3 and 9, diode 15 of the collector circuit 7 and bias diode 23.

Island 27 includes resistors 17 and 19 of the collector circuit 7 and bias diode 21.

Islands 26 and 28 are built symmetrically to island 25 and 27 respectively. Island 29 includes two input condensers 11 and 12. Connectors for the electrodes of the voltage source are separated from the islands, and are represented by the reference numerals 31 and 32. Output 14 of the multivibrator is also placed on substrate 30, being separated from the islands.

This technology generates diodes 23 and 24 having transistor characteristics so that each of the diodes forms in fact with the supplementary transistors 9 and 10 respectively another pair of transistors, the transmitter-collector circuits of which are common.

Besides, two parasitical capacitances are formed in the islands 25 and 26, these capacitances being represented on FIG. 1 by the reference numerals 33, 34 and 35, 36 respectively.

This technology equally generates bias diodes 21 and 22 of the two islands 27 and 28 having transistor characteristics, these effects being represented by the dotted lines 37 and 38. Parasitical effects appearing in the island 29 are represented on FIG. 1 by equivalent transistors 39 and 40.

Figure 3:
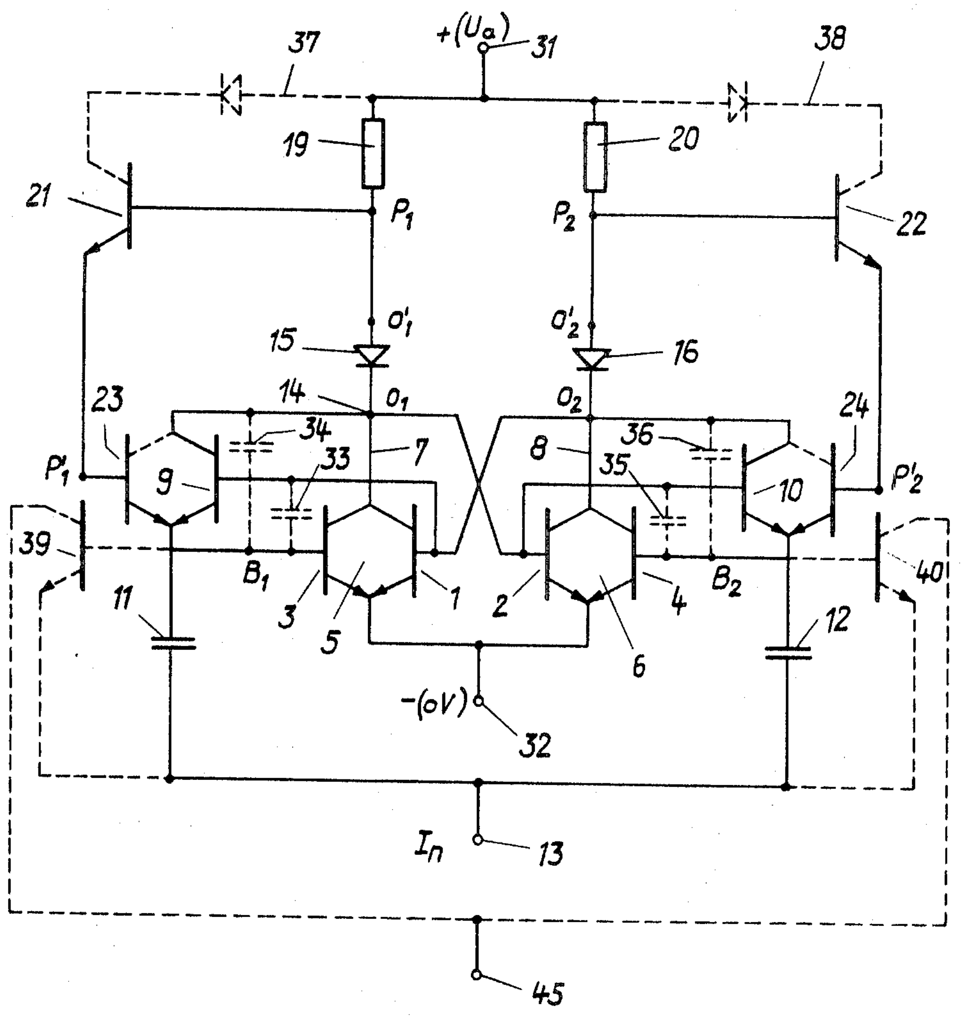
FIG. 3 shows the diagram of another embodiment of the multivibrator.

The circuit of FIG. 3 differs from those of FIGS. 1 and 2 by omission of the two resistors 17 and 18. Diodes 15 and 16 can be built and operated to create a potential drop of 0,5 volt. This is enough to decouple bias diodes 21, 23, and 22, 24 respectively of the collectors of the two pairs 5 and 6 of transistors.

Figure 4:
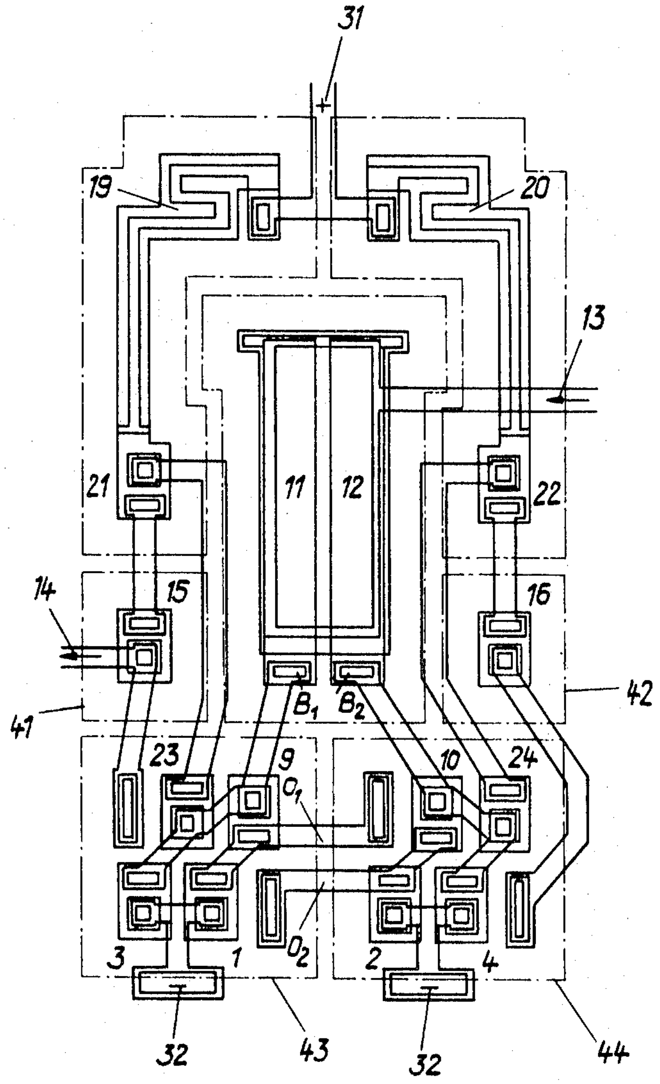
FIG. 4 shows a plan view of a semiconductor substrate in which the circuit of FIG. 3 has been integrated.

As represented in FIG. 4, the two diodes 15 and 16 are no longer placed in the islands 25 and 26 as they were in the integrated circuit of FIG. 2, but are separated in the two islands 41 and 42. Owing to the insulation of diodes 15 and 16, parasitical effects of the transistors in the islands 43 and 44, including transistors 1, 3, 9, 23 and 2, 4, 10, 24 respectively can be avoided.

In order to describe how the multivibrator operates, we have given the following reference indications:

$B_1$ and $B_2$, to the points common to the bases of the second transistors 3, 4 and the emitters of the supplementary transistors 9 and 10 respectively.

$0_1$ and $0_2$, to the points common to the collectors of pairs 5, 6 respectively and to diode 15, 16 respectively.

$P_1$ and $P_2$, to the points common to the intermediary plugs between the two resistors 17, 19, respectively 18, 20, and to bias diodes 21, 22 respectively.

$0_1'$ and $0_2'$, the points common to resistors 17 and 18 respectively and to diodes 15 and 16 respectively.

$P_1'$ and $P_2'$, the points common to bias diodes 23 and 24 respectively and to the other bias diodes 21 and 22 respectively.

Point $0_1$ corresponds to output 14.

In the circuit of FIG. 3, points $P_1$ and $0_1'$ and $P_2$ and $0_2'$ are identical.

Assume that the multivibrator is in the state where pair 6 of transistors is blocked and the first transistor 1 of pair 5 is conducting. In this state, transistor 10 is equally blocked, while the supplementary transistor 9 is conducting.

As the potentials at points $0_1$ and $P_1$ are low, the potential of point $B_1$ is also low. The potential of point $B_2$ is on the contrary relatively high, though slightly lower than that of point $P_2$.

When a signal, constituted by an accelerating potential of short duration appears at input 13, it is applied to points $B_1$ and $B_2$ through capacitances 11 and 12. The potential at point $B_1$ was already low before the appearance of the input signal. The short current impulse generated by the input signal does not block transistor 3, as this impulse is at least partially conducted to point $0_1$ by transistor 9 which is conducting, at which point this impulse is divided between the two transistors 1 and 2.

The current impulse produced at point $B_2$ by the input signal therefore cannot reach point $0_2$ as transistor 6 is still blocked when the input signal arrives. The current impulse then is conducted through the base and the emitter of transistor 4 which to collector 8. The potential of point $0_2$ is greatly reduced: transistor 1 is blocked and the potential of point $0_1$ increases.

The current impulse conducted through transistor 9, and the direct current flow through diode 15 positively switches transistor 2 of pair 6 to its conducting state, in which it remains until a new impulse reverses the process.

When the potential at point $0_1$ increases, the supplementary transistor begins as well to conduct, so that the multivibrator circuit is again in a state to receive the next input impulse.

Therefore, we can see that in the case of a simple multivibrator circuit, only an input impulse with a relatively large amplitude and duration can induce a change of state, as each active element of the circuit reacts to a voltage or current change which is in excess of a certain value only. Besides, the elements react only with delay.

In these simpler circuits, the evolution in the course of time of the various processes induced by an input impulse can occur in such a way that for short duration input impulses, the circuit does not remain at the new state, but returns to the previous one.

Owing to the various elements included in the circuit, the evolution in the course of time of the different processes is regulated in such a way that an input signal of very low amplitude and duration is sufficient to switch the circuit from one state to another, and to positively discriminate the input signals.

In a special mode of execution of the circuit, the capacity of the input condensers 11 and 12 is slightly lowered by coupling in parallel the base-emitter and base-collector circuits of the equivalent transistors 39 and 40. This is obtained in the integrated circuit in substrate 30 by short-circuiting contact 13 with a collector contact 45.

Parasitical contacts 33 and 34 of the island 25 and parasitical capacitances 35 and 36 of the island 26 have a very favorable influence on the functioning of the multivibrator circuit, by decelerating the potential acceleration on points $O_1$ and $O_2$ respectively during switching of the circuit from one state to another.

Diodes 15 and 16, placed in the collector circuits 7 and 8, present the advantage of acting under predetermined conditions of operation, and with small dimensions, as resistors of relatively high value. In addition they maintain operating conditions independent of the temperature, owing to their temperature compensating effect.

Though it is possible to omit the plugs between resistors 17, 19 and 18, 20 respectively at points $P_1$ and $P_2$, they are very advantageous in certain fields of application, because they permit increasing the maximum frequency that can be derived under conditions of low temperature, or to reduce the supply voltage and power consumption for given temperatures or frequencies.

Bipolar transistors can of course be replaced by MOS transistors, i.e., field effect transistors.

I claim:

1. A bistable multivibrator comprising
   a. first and second symmetrically arranged transistor pairs, each of said pairs including first and second transistors having their emitters connected together to form a common-emitter circuit and their collectors connected together to form a common-collector circuit, the base of the first transistor of each of said pairs being connected to the common-collector circuit of the other pair,
   b. first and second supplementary transistors, each of said supplementary transistors having its collector connected to the common-collector circuit of a corresponding transistor pair, its base to the base of the first transistor of said corresponding transistor pair and its emitter to the base of the second transistor of said corresponding transistor pair, and
   c. first and second pairs of bias diodes, each said pairs of bias diodes being coupled respectively between the base of the second transistor and common-collector circuit of one of said first and second symmetrically arranged transistor pairs.

2. A multivibrator according to claim 1, wherein one of the bias diodes situated at the base of the second transistor of each of the pairs is a transistor, the multivibrator being an integrated circuit, this transistor forming with the supplementary transistor of the corresponding pair, a common emitter-collector circuit, its base being connected through the other bias diodes to the collector circuit of the pair of transistors.

3. A multivibrator according to claim 1, wherein a diode is connected in the collector circuit of each pair of transistors.

4. A multivibrator according to claim 2, wherein each of the pairs of transistors is integrated separately with the corresponding supplementary transistor and one of the two bias diodes in an insulated island of a semiconductor substrate in which is integrated the whole circuit.

5. A multivibrator according to claim 4 which further comprises first and second ohmic resistors electrically connected in series with the common collector circuits of said first and second transistor pairs respectively, the other bias diode in each of said pairs being integrated together with the corresponding resistor in an insulated island of the semiconductor substrate.

6. A multivibrator according to claim 4, wherein two coupling condensers are integrated together at the input of the multivibrator, in an insulated island of the substrate, one of the electrodes of each of these condensers being connected to the base of the second transistor of one of the pairs respectively.

7. A multivibrator according to claim 4, wherein the diodes placed in the collector circuit of each of the pairs are integrated separately in insulated islands of the semiconductor substrate.

* * * * *